United States Patent
Ono et al.

(10) Patent No.: US 9,657,919 B2
(45) Date of Patent: May 23, 2017

(54) LIGHT-EMITTING DEVICE WITH REFLECTOR INCLUDING FIRST AND SECOND REFLECTIVE SURFACES AND LIGHT SOURCE MOUNTED ON INCLINED PLANE

(71) Applicant: NICHIA CORPORATION, Anan-shi (JP)

(72) Inventors: Masato Ono, Sagamihara (JP); Takahiro Oyu, Chiyoda-ku (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/054,135

(22) Filed: Feb. 26, 2016

(65) Prior Publication Data

US 2016/0252232 A1 Sep. 1, 2016

(30) Foreign Application Priority Data

Feb. 27, 2015 (JP) ................................. 2015-039501
Dec. 14, 2015 (JP) ................................. 2015-243393

(51) Int. Cl.
*H05G 2/00* (2006.01)
*F21V 7/06* (2006.01)
(Continued)

(52) U.S. Cl.
CPC ............. *F21V 7/06* (2013.01); *F21S 48/1159* (2013.01); *F21S 48/1317* (2013.01);
(Continued)

(58) Field of Classification Search
CPC ........................................................ F21V 7/06
(Continued)

(56) References Cited

U.S. PATENT DOCUMENTS 6,585,397 B1 * 7/2003 Ebiko ....................... F21S 8/00
  313/113
6,601,970 B2 * 8/2003 Ueda ....................... F21S 10/02
  362/11

(Continued)

FOREIGN PATENT DOCUMENTS

EP       2284435        2/2011
JP    2003-109421       4/2003
(Continued)

OTHER PUBLICATIONS

Extended European Search Report for corresponding EP Application No. 16157626.9-1551, Jul. 12, 2016.

*Primary Examiner* — Jason McCormack
(74) *Attorney, Agent, or Firm* — Mori & Ward, LLP

(57) ABSTRACT

A light emitting device includes a mount base, a light source portion, and a reflector. The mount base includes a first plane portion and a second plane portion that inclines with respect to the first plane portion. The first plane portion is provided to be parallel to an emission direction of the light emitting device. The light source portion is mounted on the second plane portion and includes at least one light emitting element. The reflector includes a first reflective surface and a second reflective surface. Light emitted from the light source portion is reflected on the first reflective surface to be emitted from the light emitting device in the emission direction. The light emitted from the light source portion is reflected on the second reflective surface toward the first reflective surface.

22 Claims, 9 Drawing Sheets

(51) Int. Cl.
  *F21S 8/10* (2006.01)
  *H01L 33/60* (2010.01)
  *F21V 7/00* (2006.01)
  *F21V 17/12* (2006.01)
  *F21Y 101/02* (2006.01)
  *F21Y 103/00* (2016.01)
  *F21Y 101/00* (2016.01)
  *F21Y 103/10* (2016.01)

(52) U.S. Cl.
  CPC ............ *F21V 7/0008* (2013.01); *F21V 17/12* (2013.01); *H01L 33/60* (2013.01); *F21Y 2101/00* (2013.01); *F21Y 2101/02* (2013.01); *F21Y 2103/003* (2013.01); *F21Y 2103/10* (2016.08)

(58) Field of Classification Search
  USPC ............ 362/235, 249.02, 249.11; 250/504 R
  See application file for complete search history.

(56) References Cited

U.S. PATENT DOCUMENTS

| | | | | |
|---|---|---|---|---|
| 2008/0278945 | A1* | 11/2008 | Venhaus | ............ F21V 7/0008 362/247 |
| 2009/0316384 | A1* | 12/2009 | Kanayama | ............ F21V 7/0025 362/84 |
| 2016/0061413 | A1* | 3/2016 | Hedberg, Jr. | ............ F21V 7/06 362/147 |

FOREIGN PATENT DOCUMENTS

| | | |
|---|---|---|
| JP | 2004-117452 | 4/2004 |
| JP | 2006-147399 | 6/2006 |
| JP | 2007-273972 | 10/2007 |
| JP | 2008-026853 | 2/2008 |
| JP | 2008-305790 | 12/2008 |
| JP | 2011-181242 | 9/2011 |
| JP | 2013-246943 | 12/2013 |

\* cited by examiner

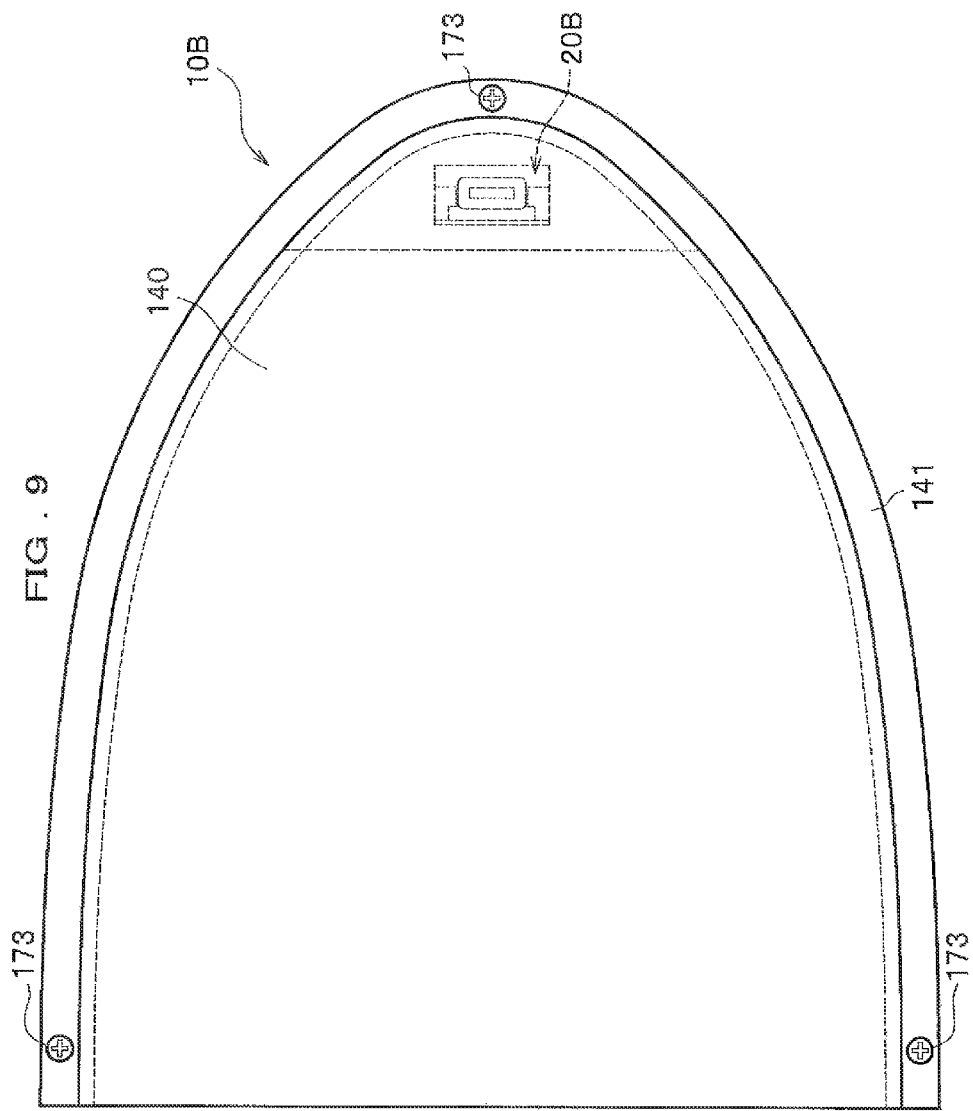

LIGHT-EMITTING DEVICE WITH REFLECTOR INCLUDING FIRST AND SECOND REFLECTIVE SURFACES AND LIGHT SOURCE MOUNTED ON INCLINED PLANE

CROSS-REFERENCE TO RELATED APPLICATIONS

The present application claims priority under 35 U.S.C. §119 to Japanese Patent Application No. 2015-039501, filed Feb. 27, 2015 and Japanese Patent Application No. 2015-243393, filed Dec. 14, 2015. The contents of these applications are incorporated herein by reference in their entirety.

BACKGROUND OF THE INVENTION

1. Field of the Invention

The present invention relates to a light emitting device.

2. Description of Related Art

In general, a light emitting device having a light emitting element such as a light emitting diode (LED) in a light source portion has been used in various fields. For example, it is proposed as a light source for a vehicle (for example, see JP 2013-246943 A and JP 2006-147399 A). The light emitting device includes a light source portion and a reflective mirror arranged to have the light source portion at the focus of the reflective mirror. The light source portion is structured as a detachable unit to be adjusted its position relative to the reflective mirror (for example, see JP 2013-246943 A). Further, an offset print machine which cures ink by irradiation of an ultraviolet ray from a light source portion uses an ultraviolet light emitting device which also includes a light source portion and a reflective mirror.

In order to irradiate an ultraviolet ray on a printed matter, the above-described conventional ultraviolet light emitting device uses a cylindrical reflective mirror of which reflective surface is a paraboloid. The ink on the printed matter is cured with the ultraviolet ray emitted from the light source portion which is provided at the focus position of the cylindrical reflective mirror.

SUMMARY OF THE INVENTION

According to one aspect of the present invention, a light emitting device includes a mount base, a light source portion, and a reflector. The mount base includes a first plane portion and a second plane portion that inclines with respect to the first plane portion. The first plane portion is provided to be parallel to an emission direction of the light emitting device. The light source portion is mounted on the second plane portion and includes at least one light emitting element. The reflector includes a first reflective surface and a second reflective surface. Light emitted from the light source portion is reflected on the first reflective surface to be emitted from the light emitting device in the emission direction. The light emitted from the light source portion is reflected on the second reflective surface toward the first reflective surface.

According to another aspect of the present invention, a light emitting device includes a mount base, a light source portion, and a reflector. The mount base includes a first plane portion and a second plane portion that is connected to the first plane portion to incline with respect to the first plane portion. The first plane portion is parallel to an emission direction of the light emitting device. The light source portion is mounted on the second plane portion and includes at least one light emitting element. The reflector includes a first reflective surface and a second reflective surface which is connected to the mount base. Light emitted from the light source portion is reflected on the first reflective surface to be emitted from the light emitting device in the emission direction. The light emitted from the light source portion is reflected on the second reflective surface toward the first reflective surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 9 is a plan view schematically showing the light emitting device according to the third embodiment.

DETAILED DESCRIPTION OF THE EMBODIMENTS

Figure 1:
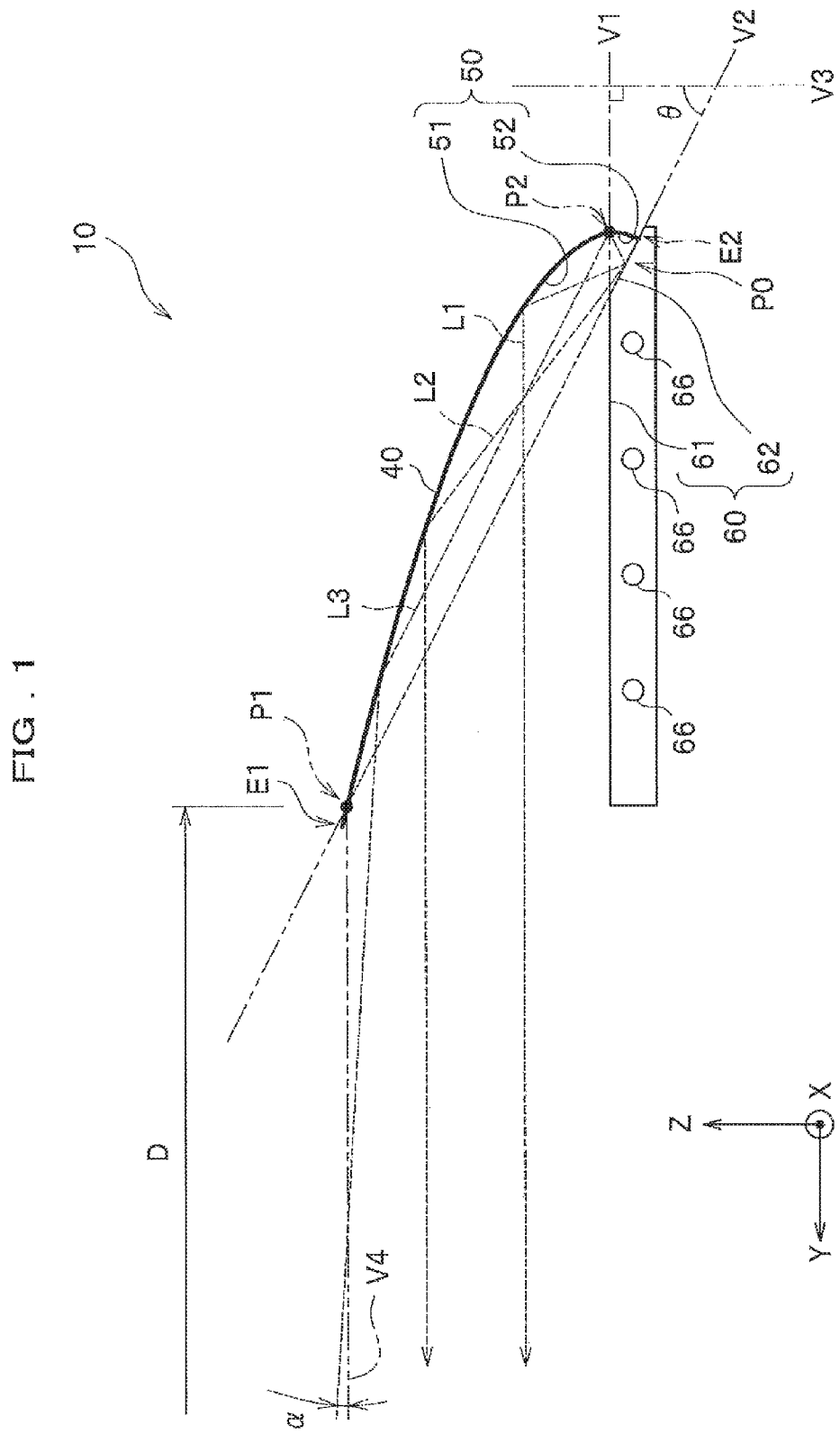
FIG. 1 is a cross-sectional view schematically showing a light emitting device according to a first embodiment.

The embodiments will now be described with reference to the accompanying drawings, wherein like reference numerals designate corresponding or identical elements throughout the various drawings.

In the following, a description will be given of a light emitting device according to embodiments of the present invention. Note that, since the drawings referred to in the following description schematically show the embodiments, the scale, intervals, or positional relationship of the constituent elements may be exaggerated, or a part of the constituent elements may not be shown. Further, in the following description, identical names and reference numerals denote identical or similar constituent elements on principle, and detailed descriptions are omitted as appropriate.

First Embodiment

Figure 2:
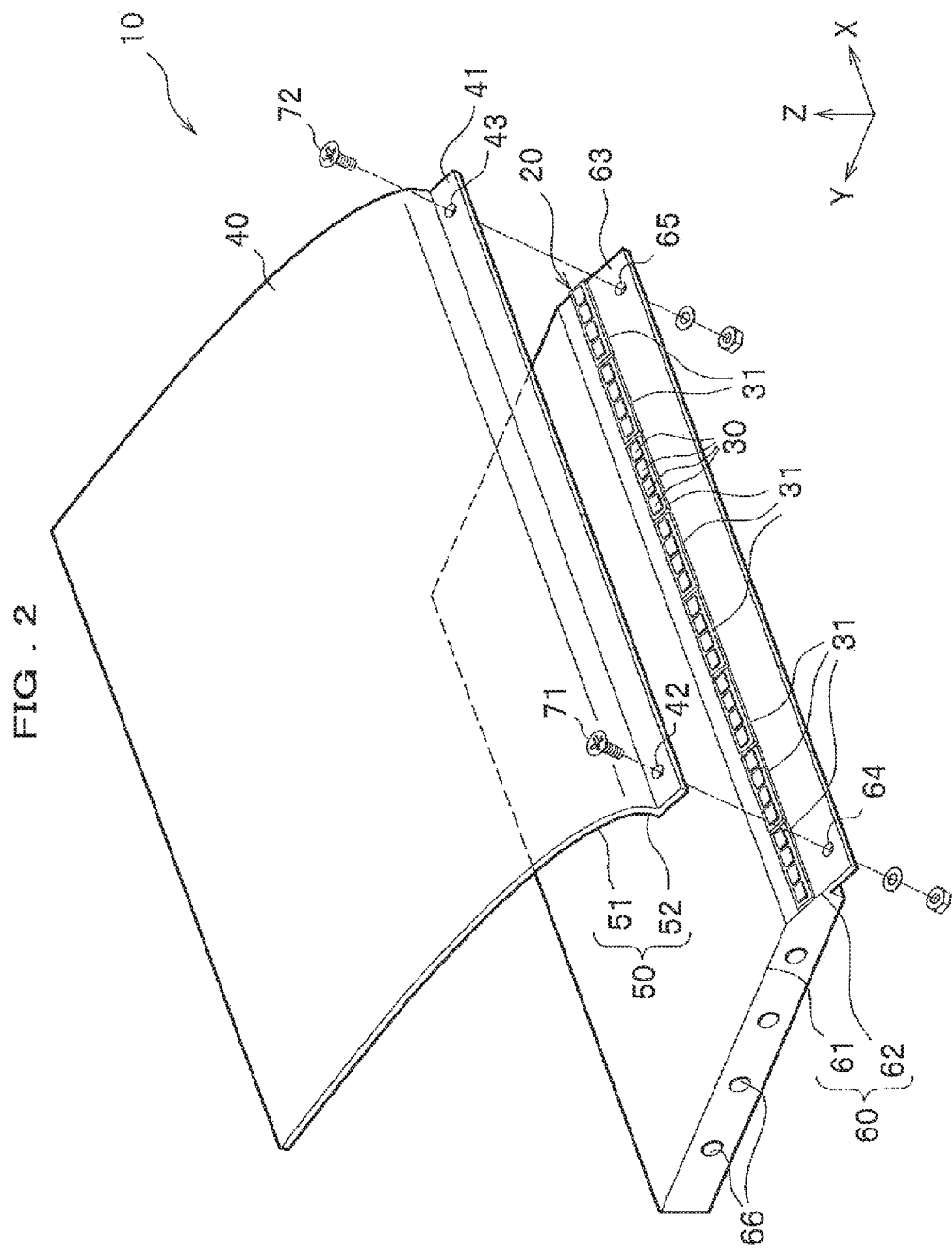
FIG. 2 is an exploded perspective view schematically showing the light emitting device according to the first embodiment.
Figure 3:
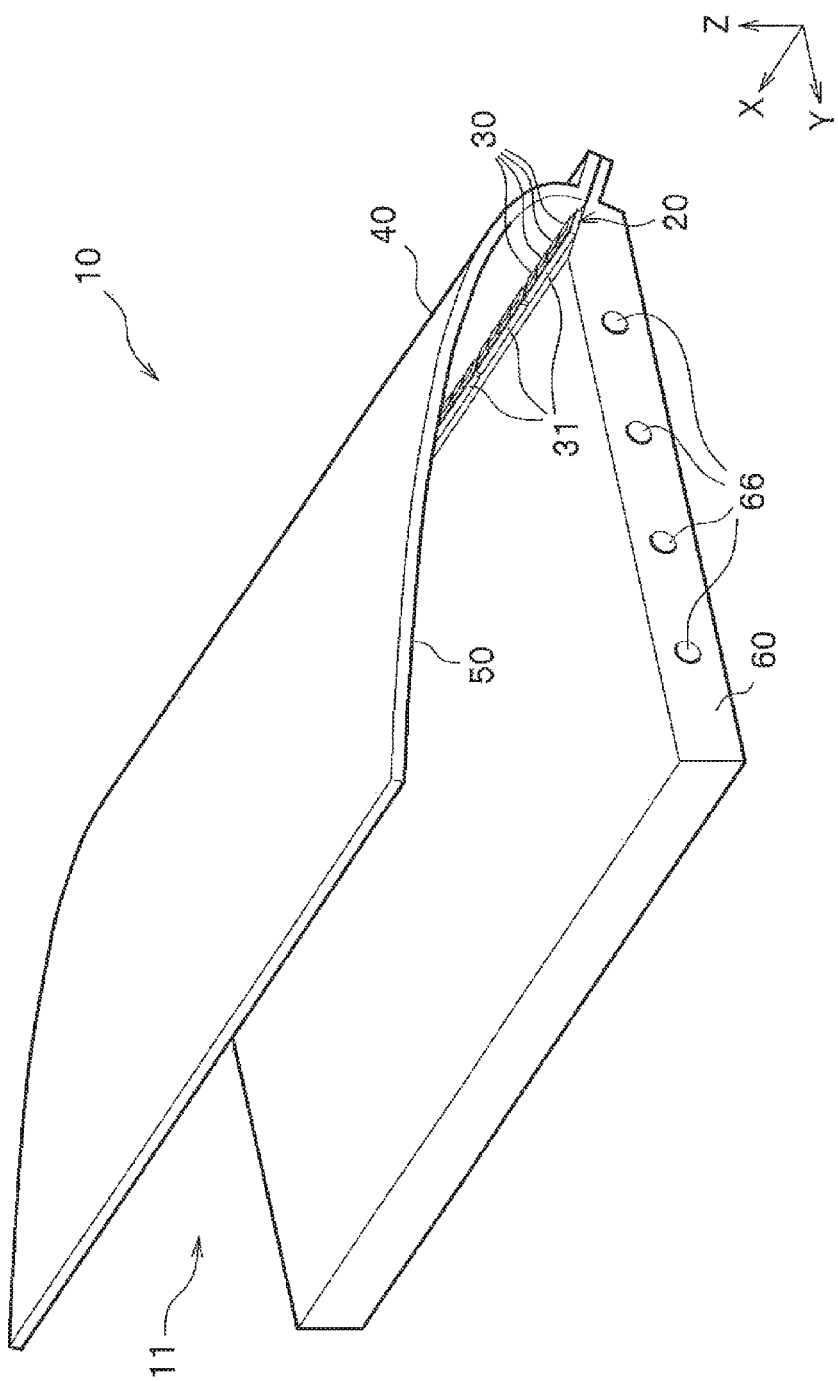
FIG. 3 is a perspective view schematically showing the light emitting device according to the first embodiment.

In the following, a description will be given of an example of a light emitting device according to a first embodiment of the present invention as an ultraviolet ray emitting apparatus which cures ink or the like. As shown in FIGS. 1 to 3, a light emitting device 10 of the present embodiment mainly includes a light source portion 20, a reflector 40, and a mount base 60. As shown in FIG. 3, the light emitting device 10 has an opening 11, which is structured by the reflector 40 and the mount base 60 coupled to each other on the side opposite to the light emitting direction and spaced apart toward the light emitting direction side. The light emitting device 10 outputs light (ultraviolet light) in the horizontal direction, toward a targeted irradiated surface being spaced apart by a given distance (for example, 10 mm or more).

In the following, depending on the situation, a description will be given based on that the extension direction of the light source portion 20 in a linear shape is denoted as X-direction, the emission direction of the light emitting device 10 is denoted as Y-direction, and the direction in which the light emitting device 10 is mounted on an external support member is denoted as Z-direction.

The light source portion 20 according to the present embodiment includes a plurality of light emitting elements 30 aligned linearly in line as shown in FIG. 2. In this manner, aligning the plurality of light emitting elements 30 linearly in line as the light source portion 20 allows for forming the light source portion 20 of desired length and size. Note that, in the present specification, being linear is not limited to be strictly a straight line, and includes having a slight curve.

More specifically, the light source portion 20 according to the present embodiment is structured by eight substrates 31 aligned linearly in line, on each of which is mounted with the four light emitting elements 30 formed similarly. On the top surface of each of the substrates 31, positive and negative conductive patterns (electrodes) are arranged. Power is supplied to the light emitting elements 30 via the conductive patterns.

Though the shape, size and the like of the light emitting elements 30 used as the light source portion are not particularly limited, in the present embodiment, as an example, the light emitting elements 30 are each a rectangular parallelepiped (a die shape).

The light emission wavelength of the light emitting elements 30 can be arbitrarily selected in accordance with the intended use. For example, in order to obtain a light emitting device having a fluorescent material, the light emitting elements 30 may suitably be nitride semiconductors ($In_xAl_yGa_{1-x-y}N$, $0 \leq X$, $0 \leq Y$, $X+Y \leq 1$) which can emit light of short wavelength capable of efficiently exciting the fluorescent material.

Further, as a representative fluorescent material which can emit mixed-color light in a white color system suitably in combination with a blue-color light emitting element and which is used as a wavelength conversion member, for example, a YAG (Yttrium Aluminum Garnet)-base, or a BOS (Barium ortho-Silicate)-base fluorescent material is suitably employed. In the present embodiment, it is assumed that the ultraviolet light is emitted.

The reflector 40 reflects light from the light source portion 20. In accordance with the use conditions of the light emitting device 10, the material, thickness, width, length and the like of the reflector 40 can be set as appropriate. The reflector 40 is preferably set above the entire light source portion 20.

The reflector 40 may be metal or a member provided with a light reflective material such as a thin metal film on the surface opposing to the light source portion 20. In the present embodiment, as shown in FIG. 2, the reflector 40 is fixed to the mount base 60 at the lower edge of the reflector 40. Specifically, a coupling portion 41 being continuous to the lower edge of the reflector 40 is fixed to an attachment portion 63 of the mount base 60 by, for example, given connecting members such as screws as described later.

As shown in FIGS. 2 and 3, the reflector 40 according to the present embodiment has a reflective surface 50 on the side opposite to the light source portion 20, and has a substantially uniform cross-sectional shape in the extension direction (X-direction) of the light source portion 20.

The reflective surface 50 reflects the light emitted from the light emitting elements 30 of the light source portion 20 provided at the focus position in the emission direction (Y-direction) parallel to a first plane portion 61 of the mount base 60. Note that, in the present embodiment, since the reflector 40 has a uniform cross-sectional shape in the X-direction, the focus of the reflective surface 50 is linearly formed in the X-direction.

The reflective surface 50 has a first reflective surface 51 and a second reflective surface 52.

The first reflective surface 51 is provided on the light emitting direction side of the reflective surface 50 to reflect the incident light in the emission direction (Y-direction). Specifically, the first reflective surface 51 according to the present embodiment has a shape with which the incident light is outputted perpendicularly (90 degrees) to the targeted irradiated surface. As shown in FIG. 1, the cross-sectional shape of the first reflective surface 51 according to the present embodiment perpendicular to the extension direction (X-direction) of the light source portion 20 is a parabola. Note that the first reflective surface 51 according to the present embodiment has a uniform shape along the extension direction (X-direction) of the light source portion 20.

The second reflective surface 52 is disposed in the reflective surface 50 on the side closer to the mount base (on the mount surface side), and reflects the light from the light source portion 20 toward the first reflective surface 51. The second reflective surface 52 has a shape for reflecting the reflection light to the end of the first reflective surface 51 on the tip side, by a narrow angle θ (the angle identical to the mounting surface of the light emitting elements 30) of extension lines (imaginary lines) V2, V3 in FIG. 1 when measured from Z axis or an angle smaller than θ (the angle formed by light incident on the first reflective surface 51). As shown in FIG. 1, the cross-sectional shape of the second reflective surface 52 perpendicular to the extension direction (X-direction) of the light source portion 20 is a parabola. The parabola forming the second reflective surface 52 and the parabola forming the first reflective surface 51 are different from each other in curvature. Note that the second reflective surface 52 has a uniform shape along the extension direction (X-direction) of the light source portion 20.

The mount base 60 is provided for mounting the light source portion 20. The light source portion 20 is mounted at the focus of the reflector 40. In the present embodiment, the focus of the first reflective surface 51 and the focus of the second reflective surface 52 coincide with each other in the cross section of the first reflective surface 51 and the second reflective surface 52 perpendicular to the extension direction (X-direction) of the light source portion 20.

The material, thickness, width, length and the like of the mount base 60 are determined in accordance with the use conditions of the light emitting device 10. The mount base 60 is preferably made of a material exhibiting high thermal conductivity, such as metal (for example, copper, aluminum), ceramic representative of aluminum nitride, and carbon. Thus, the mount base 60 can efficiently release heat of the light source portion 20.

In order to improve the heat releasing function, the mount base 60 may be provided with a cooling unit. In the example shown in FIG. 1, the mount base 60 includes water channels

66 inside. Note that, instead of water, other liquid or gas such as air may be circulated. Further, the mount base 60 may be provided with fins As shown in FIG. 2, the mount base 60 according to the present embodiment includes the first plane portion 61, a second plane portion 62, and the attachment portion 63.

Here, the first plane portion 61 is formed to be parallel to the normal direction (Y-direction) to the targeted irradiated surface. The first plane portion 61 is formed at a higher level than the second plane portion 62 and the attachment portion 63. As shown in FIG. 1, the first reflective surface 51 and the second reflective surface 52 are divided from each other on an extension line V1 of the first plane portion 61.

The second plane portion 62 is an inclined surface being inclined to be disposed adjacent to the first plane portion 61 and in close proximity to the second reflective surface 52. On the second plane portion 62, the light source portion 20 is mounted. Thus, the mounting surface of the light emitting elements 30 is inclined relative to the emission direction.

Specifically, the second plane portion 62 is inclined such that, when the light emitting elements 30 are mounted, all the light emitted from the side surface near the opening 11 illuminates the first reflective surface 51 (point P1: see FIG. 1). Note that FIG. 1 is a schematic diagram and it is assumed that the light emitting elements 30 are disposed at the position of a point P0.

The second plane portion 62 according to the present embodiment is inclined relative to the emission direction within, for example, an angle range smaller than 45 degrees. In other words, when represented by angle $\theta$ in FIG. 1 measured from Z-axis (the angle identical to the mounting surface of the light emitting elements 30), the inclination angle $\theta$ of the second plane portion 62 is set to be greater than, for example, 45 degrees.

The inclination of the second plane portion 62 should be formed to be greater than 0 degrees relative to the emission direction. Here, by increasing the inclination degree of the second plane portion 62, the length of the reflector 40 and, hence, the size of the light emitting device 10 can be reduced. For example, the inclination degree may be about 20 degrees to 55 degrees relative to the emission direction.

Note that the second plane portion 62 is formed continuous to the first plane portion 61. Here, the first plane portion 61 has an angle of 90 degrees when similarly measured from Z-axis.

Here, with reference to FIG. 1, a detailed description will be given of the disposition of the first reflective surface 51 and the second reflective surface 52, and the first plane portion 61 and the second plane portion 62.

As shown in FIG. 1, the second reflective surface 52 is formed in the reflective surface 50 from a point E2 at a given position in the second plane portion 62 to a point P2 at a given position on the extension line V1 of the first plane portion 61. Further, the first reflective surface 51 has its one end continued to the second reflective surface 52 at the point P2, and has its other end formed at a point E1 positioned on the tip side with respect to the point P1 at a given position on the extension line V2 of the second plane portion 62.

In other words, in the present embodiment, as shown in the cross-sectional view of FIG. 1, the point E1 at the end on the light emitting direction side (tip side) of the first reflective surface 51 is formed at the position farther from the point P2 than the point P1 on the extension line V2 of the second plane portion 62. That is, the point E1 is disposed at the position farther from point P2 as compared with the position (point P1) where the plane extending from the second plane portion 62 and the first reflective surface 51 cross each other. Note that the point P2 is disposed at the position where the plane extending from the first plane portion 61 and the first reflective surface 51 cross each other.

Further, the first reflective surface 51 has its other end (the end on the mount surface side in the reflective surface) formed at the position of the point P2 on the extension line V1 of the first plane portion 61. In this manner, the point E1 at the end of the first reflective surface 51 on the light emitting direction side (the tip side) is formed at the position farther from the point P2 than the point P1 on the extension line V2 of the second plane portion 62, allowing all the light emitted from the light emitting elements 30 to be reflected by the reflective surface 50. Accordingly, the emission direction can be controlled.

Still further, the end of the second reflective surface 52 on the light emitting direction side (on the tip side) is formed at the position of the point P2 on the extension line V1 of the first plane portion 61. Yet further, the other end of the second reflective surface 52 (the end on the mount surface side of the reflective surface) is formed at the position of the point E2 in the second plane portion 62 opposite to the first reflective surface 51.

Note that, in the present embodiment, the first reflective surface 51 and the second reflective surface 52 are made of an identical material by a metal plate or the like being bent.

Next, with reference to FIG. 1, a description will be given of the operation of the light emitting device 10 according to the first embodiment.

The light emitting device 10 reflects part of the light from the light emitting elements 30 (for example, optical paths L1, L2) positioned at the point P0 as the focus of the reflective surface 50 in the horizontal direction by the first reflective surface 51. Additionally, the light emitting device 10 has the inclined mounting surface of the light emitting elements 30, by which other part of the light from the light emitting elements 30 (for example, optical path L3) positioned at the focus of the reflective surface 50 is reflected by the second reflective surface 52 to be turned on the first reflective surface 51. The light is further reflected by the first reflective surface 51 and is outputted toward the opening 11. In this manner, the light emitting device 10 can achieve desired light distribution because all the light outputted in an angle range of 180 degrees about the center of the top surface of the light emitting elements 30 including the both side surfaces directly or indirectly is reflected on the first reflective surface 51.

Here, the optical path L3 shown in FIG. 1 is the critical optical path when the light from the light emitting elements 30 indirectly arriving at the first reflective surface 51 via the second reflective surface 52 deviates from the emission direction, and represents the optical path reflected by the second reflective surface 52 at the greatest angle as seen from the light emitting elements 30. On the other hand, when the light is reflected by the second reflective surface 52 by a small angle as seen from the light emitting elements 30, the optical path indirectly arriving at the first reflective surface 51 from the light emitting elements 30 critically approximates the extension line V2. Thus, the light indirectly arriving at the first reflective surface 51 from the light emitting elements 30 hardly deviates from point E1 at the end of the first reflective surface 51. Note that, though the light reflected by the second reflective surface 52 to indirectly arrive at the first reflective surface 51 slightly deviates from the point E1 at the end of the first reflective surface 51, an angle range a of diffused light at this stage is, when measured at the position of a given distance D from the point P1 in the emission direction, for example, about 3 degrees.

In this manner, the light emitting device 10, as compared with the conventional light emitting device, can efficiently reflect the light on an external irradiated surface, and thus the amount of light incident on the irradiated surface can be increased.

As has been described above, with the light emitting device 10, the light failing to be incident on the reflective surface 50 can be largely reduced, and an increase in the light distribution characteristics or in the peak illuminance of the light can be attained.

The light emitting device 10 is particularly suitable for the case where the distance between the light source and a printed matter is great, as with an offset print machine using ink which is cured by irradiation of an ultraviolet ray. Further, with the light emitting device 10, since the light can be concentrated in a narrow range such as an elongated irradiated surface, the light emitting device 10 has also an advantage in the case, for example, where a site not desired to be irradiated with the ultraviolet light exists near a site desired to be irradiated with the ultraviolet light in connection with a printed matter being the irradiation target. Specifically, for example, the site in a printing paper surface where ink is sprayed is the site desired to be irradiated with the ultraviolet light. On the other hand, the inkjet nozzle (ink discharge port) provided in close proximity to the printing paper surface is the site not desired to be irradiated with the ultraviolet light. This is because, when the nozzle supplying ink is irradiated with the ultraviolet light, ink is cured around the nozzle unit, which may invite clogging or the like of the nozzle.

The method of coupling the mount base 60 with the reflector 40 is not particularly limited. In the present embodiment, as shown in FIG. 2, the attachment portion 63 of the mount base 60 is adjacent to the second plane portion 62, and fixed to the coupling portion 41 of the reflector 40 by given coupling members such as screws. Specifically, as shown in FIG. 2, threaded holes 64, 65 as through holes are formed at the attachment portion 63. Further, as shown in FIG. 2, at the coupling portion 41 of the reflector 40, threaded holes 42, 43 as through holes are formed. Thus, by the screws 71, 72 being screwed with the threaded holes 64, 65 of the attachment portion 63 and the threaded holes 42, 43 of the coupling portion 41, the reflector 40 is fixed to the mount base 60.

Second Embodiment

Figure 4:
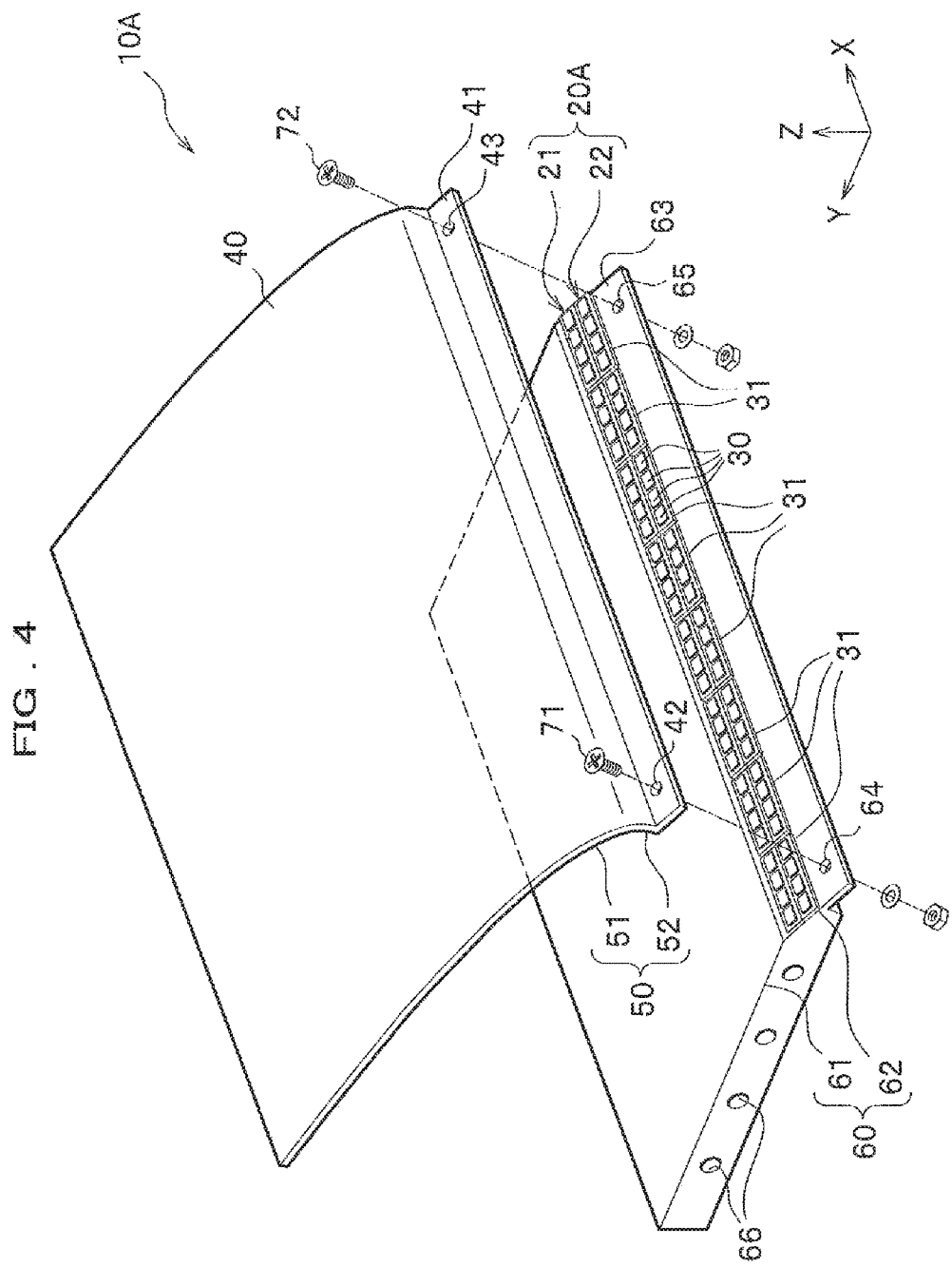
FIG. 4 is an exploded perspective view schematically showing a light emitting device according to a second embodiment.

A light emitting device 10A shown in FIG. 4 is different from the light emitting device 10 shown in FIG. 2 in that a plurality of light emitting elements 30 are disposed to form two lines at a light source portion 20A. Accordingly, the constituent elements similar to those of the light emitting device 10 shown in FIG. 2 are denoted by the same reference numerals, and descriptions thereof will be omitted.

The light source portion 20A includes a first light source portion 21 and a second light source portion 22.

The first light source portion 21 includes a plurality of light emitting elements 30 linearly disposed in X direction.

The second light source portion 22 includes a plurality of light emitting elements 30 linearly disposed so as to be parallel to the first light source portion 21. The second light source portion 22 is disposed in close proximity to the first light source portion 21.

More specifically, the first light source portion 21 and the second light source portion 22 are each structured by eight substrates 31 aligned linearly in line, on each of which is mounted with the four light emitting elements 30 formed similarly.

In the light emitting device 10A, the center position of the first light source portion 21 and the second light source portion 22 is the focus of the reflective surface 50. With the light emitting device 10A, the number of mounted light emitting elements 30 can be increased to allow the light to be more outputted.

In the foregoing, though the description has been given of the light emitting device according to the embodiments of the present invention, the present invention is not limited thereto. For example, in the embodiments, though the cross-sectional shape of the first reflective surface 51 perpendicular to the extension direction (X-direction) of the light source portion 20 is a parabola, the shape is not limited thereto. It may be a pseudo-parabola formed continuously to the parabola while the angle of the line being varied, or may be an elliptic curve.

Further, in the embodiments, the cross-sectional shape of the first reflective surface 51 and the second reflective surface 52 perpendicular to the X-direction is a parabola, and the reflective surface 50 has the shape with which the light reflected by the reflective surface 50 turns to parallel light. However, the present invention is not limited thereto, and the reflective surface 50 may have the shape with which the reflected light turns to condensed light. For example, if the cross-sectional shape of the reflective surface perpendicular to the X-direction is formed in an elliptic curve, the reflected light from the reflective surface can be rendered to condensed light.

Though the reflector 40 has been described to have a substantially uniform cross-sectional shape, it may not be uniform depending on the shape of the irradiated range or the like.

Further, as shown in FIG. 3, the light emitting device 10 has openings respectively at the opposite ends in the extension direction (X-direction) of the light source portion 20 in addition to the opening 11 in the emission direction (Y-direction). Hence, it is also possible to form one unit module made up of a plurality of light emitting devices 10, and to arrange a plurality of the unit modules in line in the extension direction (X-direction) of the light source portion 20, to thereby form a light emitting device. Thus, with an offset print machine, the light emitting device can be used as a general-purpose ultraviolet ray emitting apparatus capable of handling printed matters of various sizes. For example, when one unit module is structured as a device suitable for size-A4 printed matters in portrait orientation, by aligning two unit modules in the X-direction, a device suitable for size-A2 printed matters in the same orientation can be implemented. Similarly, by aligning four unit modules in the X-direction, a device suitable for size-A0 printed matters in the same orientation can be implemented.

Still further, though it has been described that the normal direction to the targeted irradiated surface is the emission direction (Y-direction), it is not essential for the emission direction of the light emitting device 10 to be perpendicular to the targeted irradiated surface. It is also possible to change the mounting direction of the light emitting device 10 such that the light is emitted diagonally to the irradiated surface.

Figure 5:
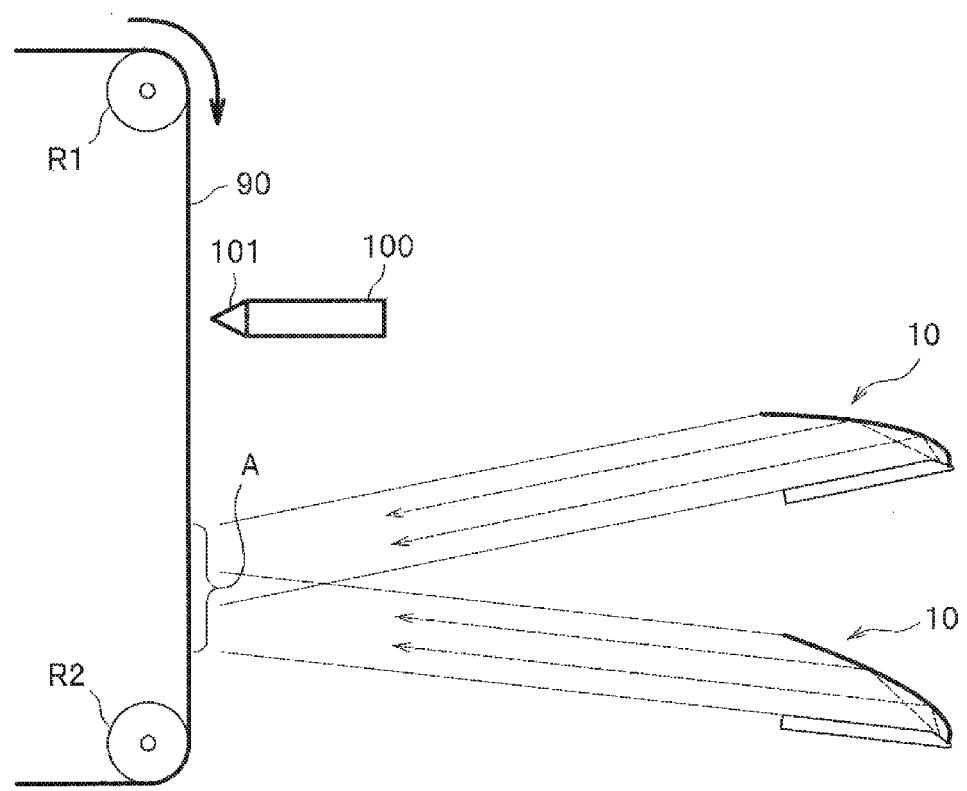
FIG. 5 is a cross-sectional view schematically showing exemplary usage in which a plurality of light emitting devices are disposed.
Figure 6:
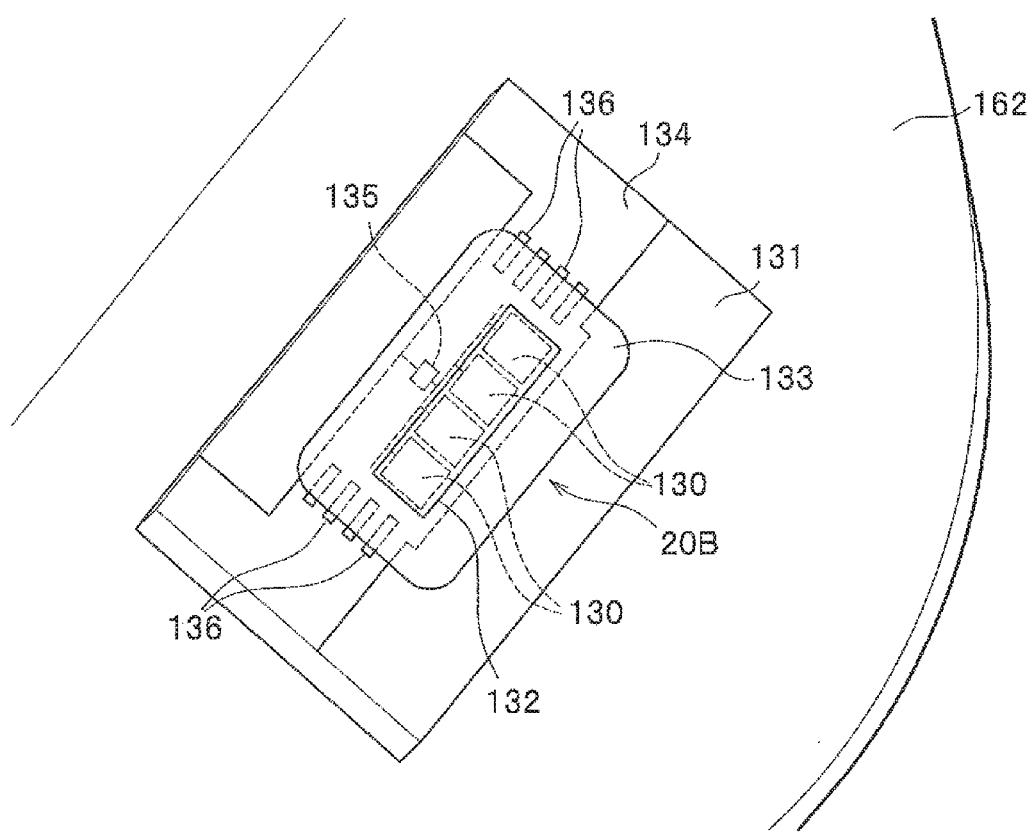
FIG. 6 is a perspective view schematically showing in an enlarged manner a light source portion of a light emitting device according to a third embodiment.
Figure 7:
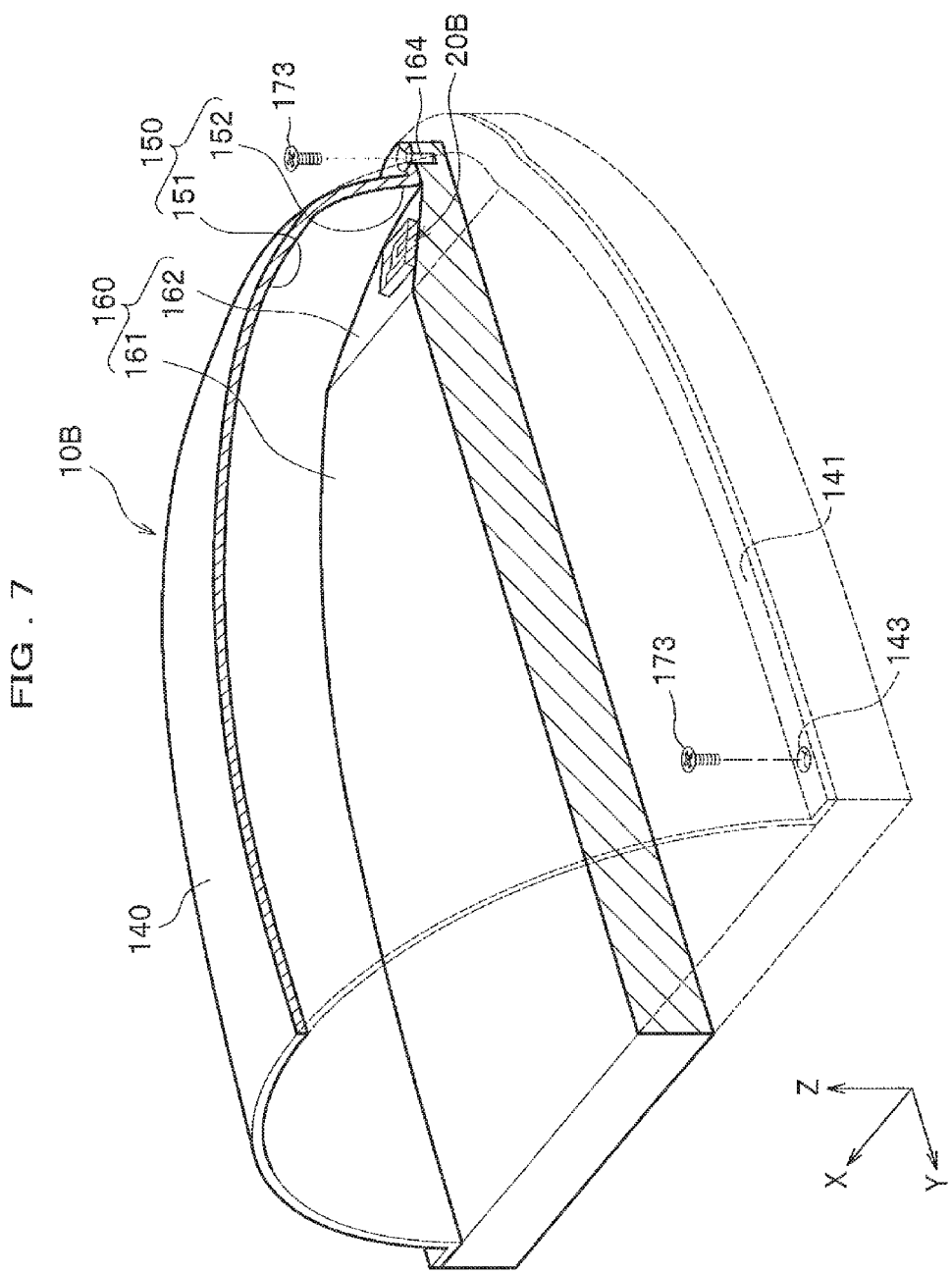
FIG. 7 is a perspective view schematically showing the light emitting device of which reflector is partially cut away according to the third embodiment.
Figure 8:
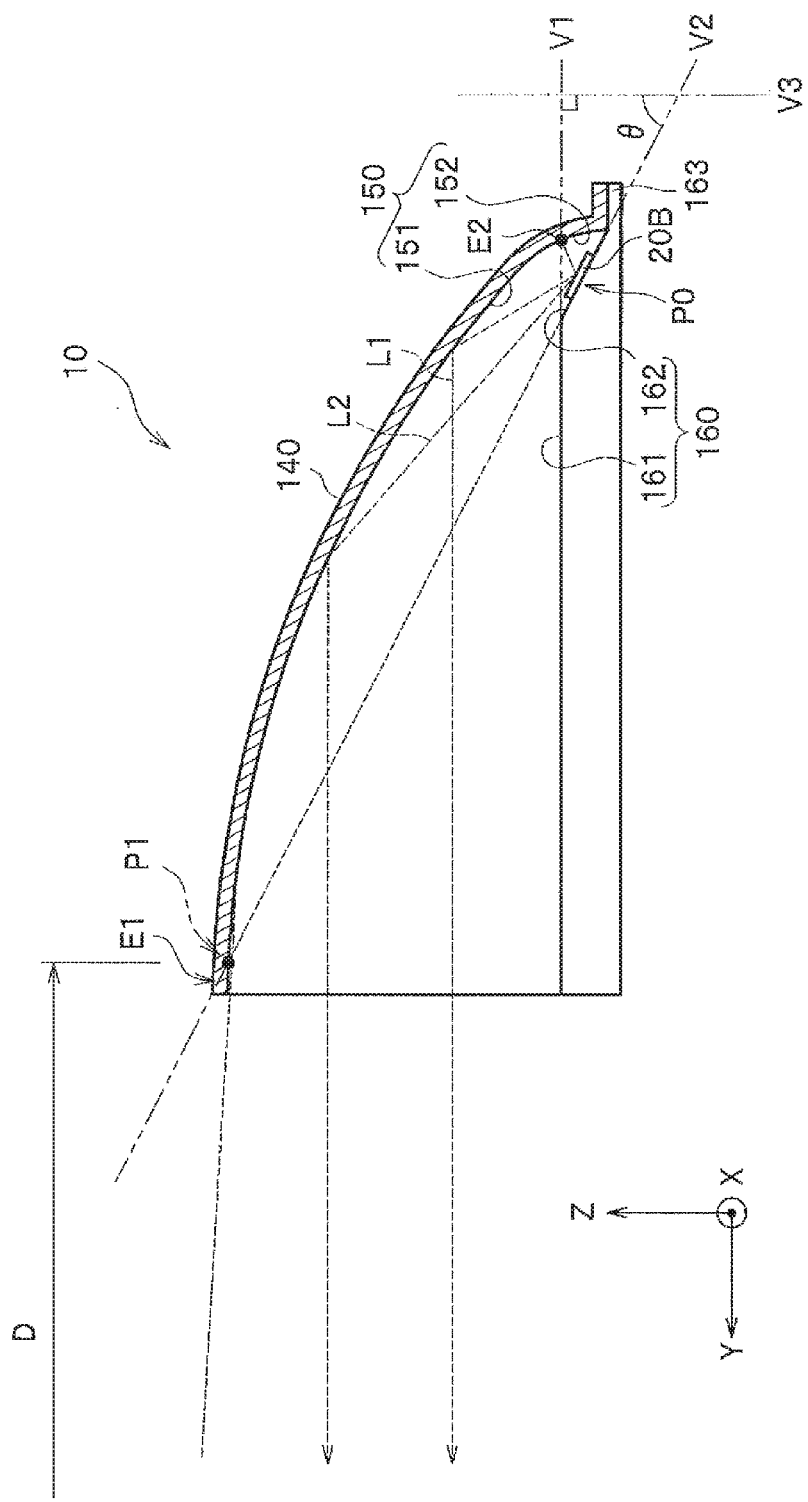
FIG. 8 is a cross-sectional view schematically showing the light emitting device according to the third embodiment.

Yet further, as shown in FIG. 5, two or more unit modules in the mounting direction (Z-direction) of the modules may be formed to have the light emitting device 10 as a unit module. For example, as shown in FIG. 5, in an offset print machine, it is assumed that a piece of printing paper 90 is conveyed by a conveying roller R1, a driven roller R2 and the like at a prescribed speed, ink is supplied from a nozzle (ink discharge port) 101 of an inkjet system 100, and the printing paper 90 is irradiated with the ultraviolet ray when passing through an elongated area A extending in the direction perpendicular to FIG. 5. In this case, the two light emitting devices 10 should be mounted having their respective openings oriented toward the area A. In general, the curing time (drying time) of ink by an ultraviolet ray depends on the distance from the light emitting device 10 to the irradiated surface and the light amount of the ultraviolet light, and the conveying speed of the printing paper 90 is determined accordingly. As shown in FIG. 5, increasing the ultraviolet light amount by the two light emitting devices 10 allows the required curing time (drying time) to be reduced and the conveying speed of the printing paper 90 or any printed matter to be increased.

Still further, though the light emitting device has been described as the ultraviolet ray emitting apparatus, the light emitting elements 30 may emit light other than ultraviolet light, such as visible light or infrared light. The application of the light emitting device is not limited to ultraviolet ray emission, and the light emitting device can be used for reading information, for an illumination apparatus with enhanced optical density, and for a vehicle. When the light emitting device is used for an illumination apparatus or a vehicle, the light emitting elements 30 may be, for example, light emitting elements emitting blue-color light. Thus, in combination with a wavelength conversion member, a light emitting device capable of emitting white-color light can be obtained.

An exemplary light source portion used for a vehicle may be a light source portion 20B and a reflector 140 of the structure shown in FIGS. 6 to 9. More specifically, the light source portion 20B may be made up of four light emitting elements 130 linearly mounted on one substrate 131, or may be made up of a plurality of substrates 131 linearly aligned in line, on each of which the four light emitting elements 130 are mounted. Note that, in FIGS. 6 to 9, the light emitting device 10B is illustrated as an example in which the light source portion 20B includes one substrate 131 on which the four light emitting elements 130 are mounted.

One light source portion 20B includes, on the substrate 131, the four light emitting elements 30, a light-transmissive member 132 provided at the top surface of the light emitting elements 30, and a light-reflective member 133 covering the side surfaces of the light emitting elements 30 and the light-transmissive member 132.

The light-transmissive member 132 is a material capable of transmitting light from the light emitting element 130 and releasing the light to the outside. The light-transmissive member 132 may contain a light diffusing agent, or a fluorescent material capable of converting the wavelength of at least part of the incident light. Specifically, for example, the light-transmissive member 132 may be a monocrystal or a polycrystal of a fluorescent material, a cut piece of a fluorescent material ingot such as a sintered body of fluorescent material powder, or a sintered product obtained by mixing fluorescent material powder with resin, glass, an inorganic material or the like. The thickness of the light-transmissive member 132 is not particularly limited and can be changed as appropriate. For example, the thickness may be about 50 μm to 300 μm.

Further, the light-reflective member 133 has a function of covering the side surfaces of the light emitting element 130 and the light-transmissive member 132, thereby reflecting light from the light emitting element 130 inside the light emitting element 130 or the light-transmissive member 132 and outputting the light to the outside via the light-transmissive member 132. The light-reflective member 133 may be made of a base material of resin such as silicone resin, modified silicone resin, epoxy resin, modified epoxy resin, acrylic resin, or hybrid resin containing at least one of the foregoing resins, the base material resin containing a reflective substance. The material of the reflective substance may be an oxide containing one of Ti, Zr, Nb, Al, and Si, or AlN, MgF or the like. Preferably, the reflective substance is titanium oxide ($TiO_2$). Preferably, as the reflective substance, particles having different index of refraction from that of the base material are dispersed in the base material. Since the amount of reflected light and transmitted light varies depending on the concentration and the density of the reflective substance, the concentration and the density should be adjusted as appropriate according to the shape and size of the light emitting device.

Note that, on the substrate 131, a Zener diode 135 may be connected to an interconnection 134 together with the light emitting elements 130. Further, in order to improve the heat releasing performance of the substrate 131, the substrate 131 may be formed with through holes 136 penetrating through the substrate 131 from the interconnection 134.

A mount base 160 is formed to correspond to the shape of the reflector 140 in planar view. Further, the mount base 160 includes a first plane portion 161, a second plane portion 162 formed continuously from the first plane portion 161 and inclined from the first plane portion 161 by a given angle, and an attachment portion 163 formed at the periphery of the first plane portion 161 and the second plane portion 162. Threaded holes 164 are formed at the attachment portion 163. Note that the mount base 160 has a shape forming an outer shape contour formed along a parabola in planar view.

The reflector 140 includes a reflective surface 150 as a paraboloid (the surface of which cross section is a parabola). The reflector 140 includes a coupling portion 141 at the periphery. The coupling portion 141 is formed with threaded holes 143. The reflector 140 is detachably fixed to the attachment portion 163 formed at the periphery of the mount base 160 having the coupling portion 141 opposed thereto, via connecting members 173 such as screws. The reflective surface 150 includes a first reflective surface 151 and a second reflective surface 152. With the light source portion 20B as a pseudo-point light source, the first reflective surface 151 and the second reflective surface 152 are formed to be paraboloids having an identical focus at the position of the light source portion 20B functioning as a pseudo-point light source.

Accordingly, the light emitted from the light emitting element 130 of the light source portion 20B provided at the focus position comes incident to the first reflective surface 151 and the second reflective surface 152 (the reflective surface 150) and reflects into the emission direction (Y-direction) parallel to the first plane portion 161 of the mount base 160. Note that, in the present embodiment, the reflector 140 has a shape of paraboloid obtained by half a rotation of a parabola. The focus of the reflective surface 150 is at one point on the second plane portion 162. Accordingly, the light source portion 20B as a pseudo-point light source is disposed such that the center of gravity of the four light emitting elements 130 coincides with the focus position of the reflective surface 150.

The light emitting device 10B structured as described above, when used as an in-vehicle headlight, is capable of emitting visible light of great emission strength as a high beam required to illuminate a faraway object.

The light emitting device according to the embodiments of the present invention can be used for an ultraviolet ray emitting apparatus, an illumination apparatus, an in-vehicle light emitting device and the like.

A light emitting device according to an embodiment of the present invention includes: a mount base that includes a first plane portion and a second plane portion which is inclined to and adjacent to the first plane portion; a light source portion that is in a linear shape, mounted on the second plane portion and includes at least one light emitting element; and a reflector that extends in an extension direction of the light source portion and includes a reflective surface having a first reflective surface and a second reflective surface which is disposed closer to the mount base than the first reflective surface, wherein light emitted from the light source portion comes incident to the first reflective surface and reflects into an emission direction parallel to the first plane portion, and the light emitted from the light source portion comes incident to the second reflective surface and reflects toward the first reflective surface.

With the light emitting device according to the embodiments of the present invention, the use of the first reflective surface and the second reflective surface allows ineffectual light failing to be reflected on the reflective surface to be reduced. Hence, the light distribution characteristics can be improved and high peak illuminance can be attained.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
a mount base including a first plane portion and a second plane portion that inclines with respect to the first plane portion, the first plane portion being provided to be parallel to an emission direction of the light emitting device;
a light source portion mounted on the second plane portion and including at least one light emitting element; and
a reflector including a first reflective surface and a second reflective surface, light emitted from the light source portion being reflected on the first reflective surface to be emitted from the light emitting device in the emission direction, the light emitted from the light source portion being reflected on the second reflective surface toward the first reflective surface, wherein
the first reflective surface and the second reflective surface are connected at a connection portion which is located at an intersection between the reflector and a plane including the first plane portion.

2. The light emitting device according to claim 1, wherein the light source portion has a plurality of light emitting elements that are linearly aligned.

3. The light emitting device according to claim 1, wherein the first reflective surface and the second reflective surface viewed in a direction parallel to a plane perpendicular to the emission direction of the light emitting device has a parabola shape.

4. The light emitting device according to claim 1, wherein the first reflective surface viewed in a direction parallel to a plane perpendicular to the emission direction of the light emitting device has a first focus, and the second reflective surface viewed in the direction has a second focus which coincides with the first focus.

5. The light emitting device according to claim 1, wherein the at least one light emitting element emits ultraviolet light.

6. The light emitting device according to claim 1,
wherein the first reflective surface viewed in a direction parallel to a plane perpendicular to the emission direction of the light emitting device has a first end and a second end disposed at a position farther from the first end as compared with a position where a plane extending from the second plane portion and the first reflective surface cross each other, and
wherein the second reflective surface viewed in the direction has a third end and a fourth end opposite to the third end which is located at a first intersection, the fourth end extending to the second plane portion on a side that is opposite to the first reflective surface.

7. The light emitting device according to claim 2, wherein the light source portion includes a first light source portion in which the plurality of light emitting elements are linearly disposed, and a second light source portion in which the plurality of light emitting elements are linearly disposed in parallel with the first light source portion.

8. The light emitting device according to claim 1, wherein the first reflective surface viewed in a direction parallel to a plane perpendicular to the emission direction of the light emitting device has either an elliptic curve shape or a pseudo-parabola shape in which lines are continuously formed along a parabola while varying angles of the lines.

9. The light emitting device according to claim 1, wherein the first reflective surface and the second reflective surface are provided to have a shape with which reflected light turns to parallel light or a shape with which the reflected light turns to condensed light.

10. A light emitting device comprising:
a mount base including a first plane portion, a second plane portion that is connected to the first plane portion to incline with respect to the first plane portion, and an attachment portion having a first threaded hole, the first plane portion being parallel to an emission direction of the light emitting device;
a light source portion mounted on the second plane portion and including at least one light emitting element; and
a reflector including a first reflective surface, a second reflective surface which is connected to the mount base, and a coupling portion having a second threaded hole which coincides with the first threaded hole of the attachment portion in a top view to be attached with a screw member, light emitted from the light source portion being reflected on the first reflective surface to be emitted from the light emitting device in the emission direction, the light emitted from the light source portion being reflected on the second reflective surface toward the first reflective surface.

11. The light emitting device according to claim 10, wherein the light source portion has a plurality of light emitting elements that are linearly aligned.

12. The light emitting device according to claim 10, wherein the first reflective surface and the second reflective surface are connected at a connection portion which is located at an intersection between the reflector and a plane including the first plane portion.

13. The light emitting device according to claim 10, wherein the first reflective surface and the second reflective surface viewed in a direction parallel to a plane perpendicular to the emission direction of the light emitting device has a parabola shape.

14. The light emitting device according to claim 10, wherein the first reflective surface viewed in a direction parallel to a plane perpendicular to the emission direction of the light emitting device has a first focus, and the second reflective surface viewed in the direction has a second focus which coincides with the first focus.

15. The light emitting device according to claim 10, wherein the at least one light emitting element emits ultraviolet light.

16. The light emitting device according to claim 10,
wherein the first reflective surface viewed in a direction parallel to a plane perpendicular to the emission direction of the light emitting device has a first end and a second end disposed at a position farther from the first end as compared with a position where a plane extending from the second plane portion and the first reflective surface cross each other, and
wherein the second reflective surface viewed in the direction has a third end and a fourth end opposite to the third end which is located at a first intersection, the fourth end extending to the second plane portion on a side that is opposite to the first reflective surface.

17. The light emitting device according to claim 11, wherein the light source portion includes a first light source portion in which the plurality of light emitting elements are linearly disposed, and a second light source portion in which the plurality of light emitting elements are linearly disposed in parallel with the first light source portion.

18. The light emitting device according to claim 10, wherein the first reflective surface viewed in a direction parallel to a plane perpendicular to the emission direction of the light emitting device has either an elliptic curve shape or a pseudo-parabola shape in which lines are continuously formed along a parabola while varying angles of the lines.

19. The light emitting device according to claim 10, wherein the first reflective surface and the second reflective surface are provided to have a shape with which reflected light turns to parallel light or a shape with which the reflected light turns to condensed light.

20. The light emitting device according to claim 10, wherein the attachment portion is connected to the second plane portion to incline with respect to the first plane portion.

21. The light emitting device according to claim 10, wherein the coupling portion is connected to the second reflective surface to incline with respect to the reflective surface.

22. A light emitting device comprising:
a mount base including a first plane portion, a second plane portion that is connected to the first plane portion to incline with respect to the first plane portion, and an attachment portion, the first plane portion being parallel to an emission direction of the light emitting device;
a light source portion mounted on the second plane portion and including at least one light emitting element; and
a reflector including a first reflective surface, a second reflective surface which is connected to the mount base, and a coupling portion being detachably attached to the attachment portion with at least one connecting member, light emitted from the light source portion being reflected on the first reflective surface to be emitted from the light emitting device in the emission direction, the light emitted from the light source portion being reflected on the second reflective surface toward the first reflective surface, wherein
the first reflective surface and the second reflective surface are connected at a connection portion which is located at an intersection between the reflector and a plane including the first plane portion.

* * * * *